US007945412B2

(12) United States Patent
Dorsey et al.

(10) Patent No.: US 7,945,412 B2
(45) Date of Patent: May 17, 2011

(54) METHODS AND APPARATUSES FOR CALIBRATING SENSORS

(75) Inventors: John Gregory Dorsey, San Francisco, CA (US); Charles Randolph Overbeck, Sunnyvale, CA (US); William C. Athas, San Jose, CA (US)

(73) Assignee: Apple Inc., Cupertino, CA (US)

( * ) Notice: Subject to any disclaimer, the term of this patent is extended or adjusted under 35 U.S.C. 154(b) by 145 days.

(21) Appl. No.: 12/359,966

(22) Filed: Jan. 26, 2009

(65) Prior Publication Data

US 2009/0138225 A1   May 28, 2009

Related U.S. Application Data

(62) Division of application No. 11/502,934, filed on Aug. 11, 2006, now Pat. No. 7,483,803.

(51) Int. Cl.
G06F 17/40 (2006.01)
G06F 19/00 (2006.01)
(52) U.S. Cl. .......................... 702/104; 702/65
(58) Field of Classification Search ............ 702/57, 702/65, 104
See application file for complete search history.

(56) References Cited

U.S. PATENT DOCUMENTS 4,864,453 A   9/1989   Bergman et al.
6,813,719 B2  11/2004  Athas
7,312,969 B2 * 12/2007 Matsumoto et al. ......... 361/93.9
7,788,516 B2   8/2010  Conroy et al.
2004/0183550 A1  9/2004  Fehrenbach et al.

OTHER PUBLICATIONS

Bilmes, Jeff A. "A Gentle Tutorial of the EM Algorithm and its Application to Parameter Estimation for Gaussian Mixture and Hidden Markov Models", International Computer Science Institute, Berkeley, CA, Apr. 1998, 15 pgs.
Bishop, Christopher M. "Neural Networks for Pattern Recognition", Oxford University, 1995, pp. 65-72.
Minka, Thomas P. "Expectation-Maximization as Lower Bound Maximization," Nov. 4, 1998, pp. 1-8.
Zhang, Yang, et al. "On-line Calibration of Lossless Current Sensing," Applied Power Electronics Conference and Exposition (APEC '04), Nineteenth Annual IEEE, 2004, vol. 2, pp. 1345-1350, 7 pgs.

* cited by examiner

*Primary Examiner* — Bryan Bui
(74) *Attorney, Agent, or Firm* — Blakely, Sokoloff, Taylor & Zafman LLP

(57) ABSTRACT

Methods and apparatuses to perform calibration of imprecise sensors for power monitoring in a data-processing system are described. The system includes a load coupled to one or more sensors. An electronic load changes a first input signal through one or more sensors by a predetermined amount. A difference in an output signal from the one or more sensors in response to the changing is obtained. The output signal is measured and sampled. A distribution of samples of the output signal is determined. The estimated parameters of the distribution that most likely to explain actual data are determined. Next, a transfer function of the one or more sensors is determined based on the estimated parameters. The input signal through the load is accurately predicted using the transfer function of the one or more sensors to monitor the power usage by the load.

23 Claims, 15 Drawing Sheets

METHODS AND APPARATUSES FOR CALIBRATING SENSORS

This application is a divisional of U.S. application Ser. No. 11/502,934, filed on Aug. 11, 2006 now U.S. Pat. No. 7,483,803.

FIELD

Embodiments of the present invention relate to data-processing systems, and more particularly, but not exclusively, to the management of power or energy usage in the data-processing systems.

BACKGROUND

As the power or energy consumption of components of the computer systems continuously increases, the power budgets of the computer systems become tighter. It is necessary to manage power or energy consumption of a computer system to pursue high-performance goals, such as high computing power, compactness, quietness, better battery performance, etc. For example, portable computer systems, such as laptop computers, have a limited battery output capability, e.g., charge capacity. Managing of the power consumption for a given battery output capability may increase the performance of the computer system and extend a battery life. Generally, the power management allows a computer system to monitor its own energy dissipation, and adjust its performance to satisfy, for example, thermal constraints or battery lifetime goals.

FIG. 1 illustrates a typical computer system 100 that uses a precise sensor 102 for power monitoring. As shown in FIG. 1, sensor 102 is connected in series with power source 101 and a load 103 (e.g., a processor) to accurately measure the current through load 103. Typically, precise sensor 102 is a resistor having a calibrated fixed resistance, or a Hall-effect device. Typically, sensor 102 is a resistor having a tolerance value not more than ±0.5%. This resistor is often referred to as a sense resistor. Voltmeter 104 measures the potential difference between points 105 and 106 across sensor 102. By measuring voltage $V_{sense}$ between points 105 and 106 across sensor 102, the current $I_{load}$ through load 103 that is connected in series with sensor 102 is determined. Thus, to accurately measure the power of a computer system, subsystem, component, or circuit, an additional component, such as sensor 102, is introduced. Sensor 102 adds an extra cost, and also occupies an extra space in computer system 100. Sensor 102 continuously operates in computer system 100 and therefore dissipates an additional power. The power $P_{sense}$ dissipated by sensor 102 is determined as follows:

$$P_{sense} = I_{load}^2 \times R_{sense} \qquad (1)$$

Further, sensor 102 produces an extra voltage drop $V_{sense}$ between power source 101 and load 103. Thus, sensor 102 is not only intrusive to computer system 100, but also may disrupt the performance of computer system 100.

Additionally, to measure a larger current range, sensor 102 desirably has a large constant resistance, and a voltmeter 104 that is capable of reading small potential differences (e.g., microvolts and smaller), or a Hall-effect device is used. Sensor 102 having a large resistance drives up the power of computer system 100. On the other hand, voltmeters that are capable of reading the small voltages and Hall-effect devices are expensive.

Thus, the presence of sensor 102 negatively affects the performance and efficiency of the computer system 100 while increasing cost and board area.

SUMMARY OF THE DESCRIPTION

Exemplary embodiments of methods and apparatuses to perform in-circuit calibration of imprecise electrical sensor elements ("imprecise sensors") for accurate power monitoring in a data-processing system are described. The data-processing system may include one or more of a load, e.g., a microprocessor, a microcontroller, a central processing unit ("CPU"), a graphics processing unit ("GPU"), a memory, or any combination thereof, coupled to one or more imprecise sensors. To accurately monitor the power of the data-processing system (e.g., a portable computer system), an imprecise electrical sensor of the data-processing system is calibrated to determine a transfer function of the sensor. The transfer function of the sensor is used to map an output response of the sensor to an input signal to accurately track the input signal through the load coupled to the sensor. In one embodiment, the imprecise sensors are electrical elements, and/or circuits that have a resistive component. The resistive component of the imprecise sensor, even though it is designed to have a fixed-value resistance, may vary because of the temperature, frequency, current response, inconsistency in the manufacturing, and the like conditions. In one embodiment, the imprecise sensors have an imprecisely specified direct current ("DC") resistive component, and a frequency-dependent impedance. It will also be appreciated that the methods and apparatuses of the inventions may be used with more precise electrical sensors which are calibrated as described herein.

In one embodiment, an input signal through one or more imprecise sensors coupled to a load is changed by a predetermined (or measured) amount. A difference in an output signal from the one or more imprecise sensors in response to changing of the input signal, is obtained. Next, a transfer function of the one or more imprecise electrical sensors is determined based on the difference. The transfer function is normally determined while the system is in use (e.g. after a "warm up" period of time under typical environmental conditions). Using the transfer function, the input signal through the load coupled to the one or more imprecise sensors is predicted. In one embodiment, a difference in an output signal from the one or more imprecise sensors in response to changing of the input signal is obtained without synchronization with the input signal; for example, measurements of the output signal may be made without knowing the state (e.g. on or off) of the input signal. The output signal is sampled, and a distribution of the samples of the output signal is defined. Next, estimated parameters of the distribution that are most likely to explain the actual data are calculated. The difference in the output signal may be the difference in voltage levels, or the difference in duty cycles caused by changing of the input signal. In another embodiment, sampling of the output signal is synchronized with changing of the input signal.

In one embodiment, a time-varying input current signal through a sensor coupled to a first load is provided using an auxiliary circuit that includes a switch and a fixed second load. A time-varying output voltage signal caused by the input current is measured across the sensor and sampled. Samples are stored in a memory as a vector of voltage values. A distribution of the samples having at least two distribution components is defined. Next, estimated parameters for each of the distribution components are calculated using a statistical iterative algorithm by maximizing the probability that an estimated parameter explains an actual observed distribution of the samples. The statistical iterative algorithm is performed until the estimated parameters sufficiently converge. The estimated parameters are a mean value, a variance of each of the distribution components, and the probability that a sample voltage comes from one of the distribution components. The estimated parameters are used to determine a transfer function of the sensor. The actual input current flowing through the first load is accurately predicted based on the transfer function.

A system to monitor the power may include one or more imprecise electrical sensors coupled to a first load. An electronic load is coupled to the one or more sensors to induce a predetermined change in the input current. In one embodiment, the electronic load is an auxiliary circuit having a switch and a fixed second load. A power monitor is coupled to the one or more sensors and to the electronic load. The power monitor changes an input current through the one or more sensors by a predetermined amount using the electronic load. Next, the power monitor observes and measures a difference in an output signal from the one or more sensors caused by changing of the input current. In one embodiment, the system further includes a sampler coupled to the one or more sensors that samples the output signal. The power monitor receives samples of the output signal, stores the samples in the memory, determines a distribution of samples of the output signal, and calculates estimated parameters of the distribution that is most likely to explain actual data. Further, the power monitor determines a transfer function of the one or more sensors based on the difference in the output signal. Next, the power monitor accurately predicts the actual input current flowing through the load coupled to the one or more sensors based on the transfer function.

BRIEF DESCRIPTION OF THE DRAWINGS

The present invention is illustrated by way of example and not limitation in the figures of the accompanying drawings in which like references indicate similar elements.

DETAILED DESCRIPTION

The subject invention is described with reference to numerous details set forth below, and the accompanying drawings illustrate the invention. The following description and drawings are illustrative of the invention and are not to be construed as limiting the invention. Numerous specific details are described to provide a thorough understanding of the present invention. However, in certain instances, well-known or conventional details are not described in order to not unnecessarily obscure the present invention in detail.

Exemplary embodiments of methods and apparatuses to perform in-circuit calibration of imprecise electrical sensing elements ("sensors") for accurate power monitoring in a data-processing system are described below. In one embodiment, power is monitored by monitoring a current in the data-processing system, as described in further detail below. The data-processing system includes a load coupled to one or more sensors. An electronic load changes an input signal through one or more sensors by a predetermined amount. A difference in an output response from the one or more sensors caused by changing of the input signal is obtained. A transfer function of the one or more sensors is dynamically determined based on the difference in the output response. Next, the input signal through the load coupled to the one or more sensors is accurately predicted using the transfer function of the one or more sensors and the output response, to monitor the power of the data-processing system. The in-circuit calibration of imprecise electrical sensors can be applied to methods and apparatuses for dynamic power control in data-processing systems described in U.S. patent application Ser. No. 11/327,238, filed on Jan. 5, 2006, and in U.S. Pat. No. 6,813,719 which are incorporated herein in their entirety by reference.

Figure 2:
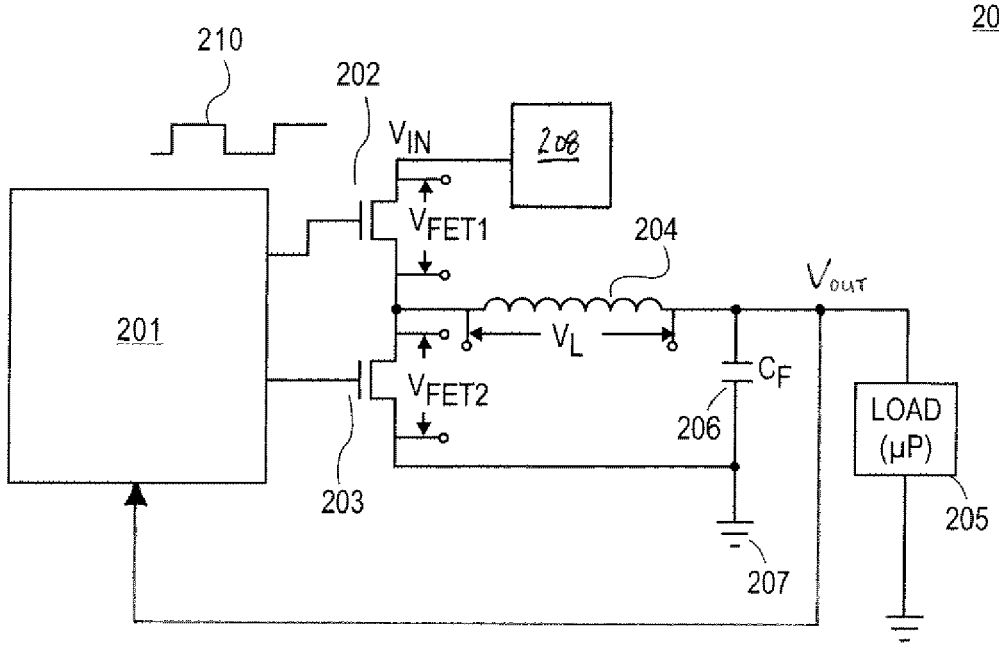
FIG. 2 shows one embodiment of a DC-DC step-down switching power supply circuit of a data-processing system.

FIG. 2 shows one embodiment of a DC-DC step-down switching voltage regulator circuit 200 of a data-processing system. As shown in FIG. 2, switching voltage regulator circuit 200 includes a power controller 201 connected to switching field effect transistor ("FET") 202 and switching FET 203. Power supply 208 is coupled to FET 202 to provide an input DC voltage $V_{in}$. Power supply 208 may include a battery, AC adapter, or any other electrical power source. Inductor 204 is coupled through transistor 202 and transistor 203 to power source 208. As shown in FIG. 2, power supply 208 provides an electrical current to load 205 through inductor 204. Load 205 may be a main processor, e.g., a central processing unit ("CPU"), core logic; a graphics processor ("GPU"), main memory, microcontroller, a microprocessor, a graphic memory controller, and any other electronic load or a combination of these components. Capacitance 206 coupled to ground 207 between load 205 and inductor 204 is used as an electrical filter, e.g., to filter out ripples in the output signal. The electrical power dissipated by load 205 is a product of current and potential provided to load 205. The electrical current through load 205 can be accurately determined using the electrical elements that are already present in the circuit for proper operation without adding precise power sensors. That is, the imprecise electrical elements, such inductor 204, transistor 202, and transistor 203 having a transfer function, e.g., an inherent internal resistance, are used to monitor the electrical power. Such components may have both DC and frequency-varying resistive components. The resistance of the imprecise electrical elements is not static and can vary depending on manufacturing variances, temperature, current response, and the like conditions. To accurately monitor the power of the data-processing system, an imprecise electrical element ("sensor"), such as inductor 204, transistors 202 and 203, is calibrated to determine the transfer function of the sensor. The transfer function of the sensor is used to map an output response (e.g., output voltage) of the sensor to an input signal (e.g., input current) to accurately track the input signal through load 205. In one embodiment, the transfer function of the imprecise electrical elements can be determined by measuring an output response of these elements to monitor the power provided to load 205.

As shown in FIG. 2, an input DC voltage $V_{in}$ that is supplied by power supply 208. $V_{in}$ induces an output response, e.g., output voltage $V_{fet1}$ across transistor 202, an output voltage $V_{fet2}$ across transistor 203, an output voltage $V_L$ across inductor 204, and an output voltage across load 205 that can be measured, as shown in FIG. 2. As shown in FIG. 2, controller 201 is configured to receive the output voltage. Output DC voltage $V_{out}$ across load 205 may be defined as follows:

$$V_{out} = D \times V_{in} \quad (2)$$

where D is a duty factor on the input waveform provided by power supply 208 and is typically less or equal to 1.

In one embodiment, D is in the approximate range of 0 and 1 ($0 \leq D \leq 1$).

The imprecise sensors can be electrical elements, and/or circuits that have a nominally fixed resistive component which may vary due to environmental conditions. The resistive component of the imprecise sensor may vary because of the temperature, frequency, current response, inconsistency in the manufacturing, and the like conditions. For example, the imprecise sensors have an imprecisely specified direct current ("DC") resistive component, and a frequency-varying resistive component, e.g., inductance. For example, the imprecise sensor may be an inductor, or a field effect transistor ("FET"), or a resistor having a tolerance value of at least 5%.

Figure 3A:
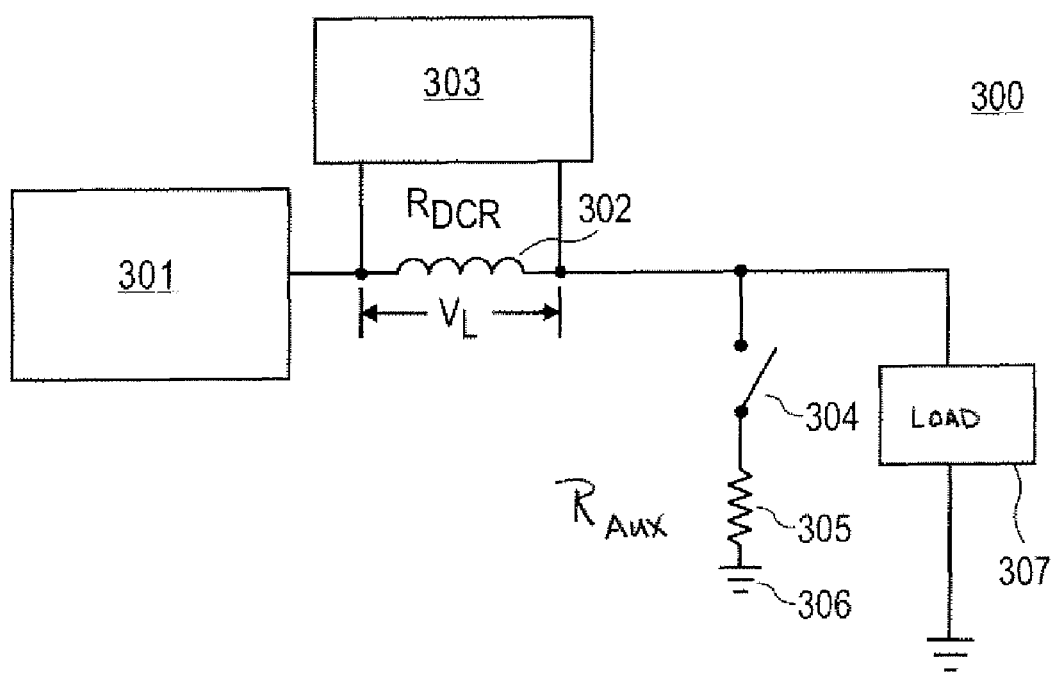
FIG. 3A shows one embodiment of a system to calibrate one or more imprecise sensors.

FIG. 3A shows one embodiment of a system 300 to calibrate one or more imprecise sensors. As shown in FIG. 3A, power supply 301 is coupled to load 307 through an imprecise component ("sensor") 302, e.g., an inductor, to provide power to the load 307.

In one embodiment, sensor 302 has an imprecisely specified DC resistance ("DCR") and a frequency-varying resistive component, e.g., inductance L. Voltmeter 303 is connected in parallel to sensor 302 to measure $V_L$ voltage across imprecise sensor 302. An auxiliary circuit containing switch 304 and an auxiliary load 305 is connected in parallel to load 307 and imprecise sensor 302, as shown in FIG. 3A. Auxiliary load 305 is coupled to ground 306, as shown in FIG. 3A. In one embodiment, resistance $R_{aux}$ of load 305 is constant and has a predetermined value, e.g., 10 Ohms and is substantially larger than resistance $R_{on}$ of switch 304. In one embodiment, switch 304 is a low resistance electrical switch that allows current to pass through auxiliary load 305 providing an additional current through sensor 302. In one embodiment, switch 304 is a low on-resistance MOSFET transistor. In one embodiment, to prevent overheating in the auxiliary load 305, waste battery energy, or both, switch 304 is toggled "ON" and "OFF" to be enabled only for a short period of time, for example, by a rectangular wave pulsed signal having a duty cycle (e.g., between 10% to 70%) and a frequency (e.g., between 5 Hz to 200 Hz). The auxiliary load 305 may be a permanent part of the overall system and may be used at least once (or repeatedly over time) to calibrate the sensor 302 or it may be a temporary part of the overall system in that it may be added, temporarily, to the system during a manufacturing phase of the assembly and testing of the system and used during that phase to calibrate the sensor in the system and then removed after calibration.

Figure 3B:
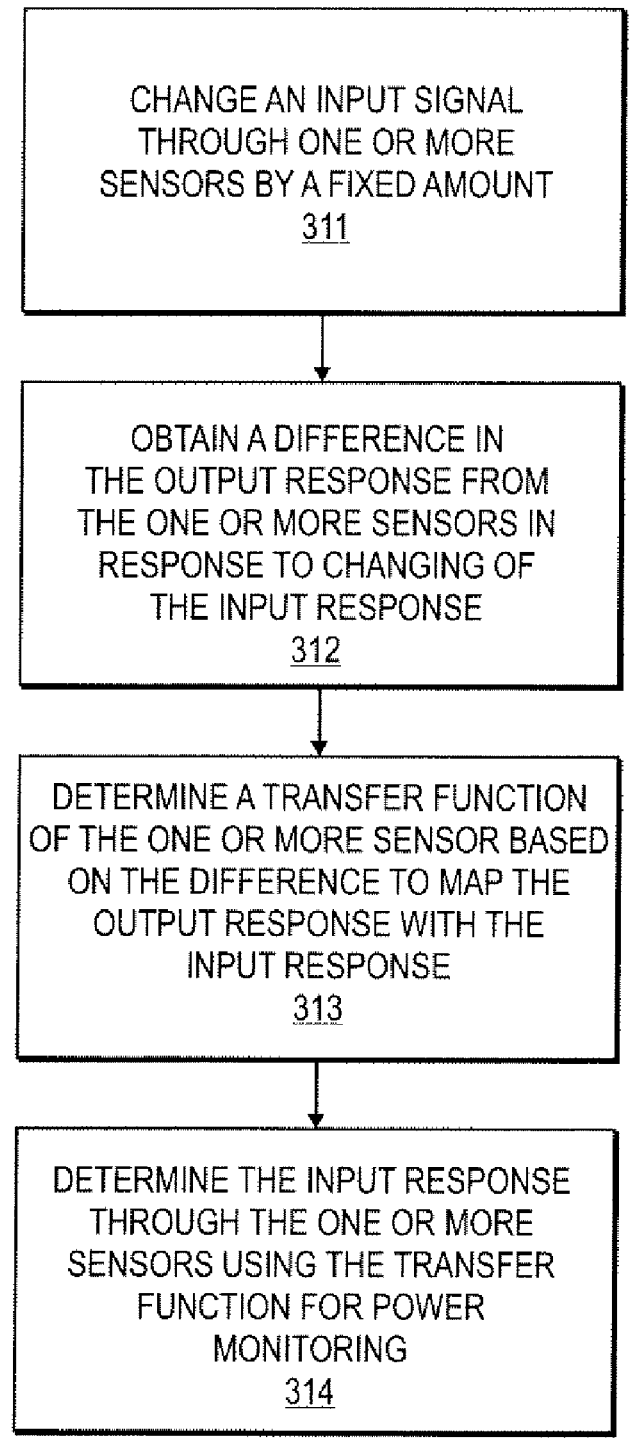
FIG. 3B is a flowchart of one embodiment of a method of calibrating one or more imprecise sensors.

FIG. 3B is a flowchart of one embodiment of a method of calibrating one or more imprecise sensors. Method 310 begins with operation 311 that involves changing an input signal through one or more sensors by a fixed amount. Referring back to FIG. 3A, the input signal, e.g., an input current through sensor 302 is changed by enabling switch 304. Because resistor 305 has a fixed resistance, the input current is changed by a fixed amount ($\Delta I$). Referring back to FIG. 3B, method 310 continues with operation 312 that involves obtaining a difference in the output response from the one or more sensors caused by changing the current. For example, voltmeter 303 can measure the change of the output voltage ($\Delta V_L$) across sensor 302 caused by the change of the input current ($\Delta I$), as shown in FIG. 3A. Referring back to FIG. 3B, method 310 continues with operation 313 that involves determining a transfer function of the one or more sensors based on the difference in the output response to map the output response to the input signal. For example, the transfer function of sensor 302, e.g., a DCR resistance, at a fixed frequency and duty cycle may be approximated as follows:

$$DCR \sim \frac{\Delta V_L}{\Delta I} \quad (3)$$

Next, referring back to FIG. 3B, operation 314 is performed that involves determining the input signal entering load 307 using the transfer function of the one or more sensors for power monitoring. Because dynamic conditions, e.g., temperature, may affect the transfer function, the calibration of sensor 302 is performed dynamically, while system 300 is operating. In one embodiment, sensor 302 can be calibrated repeatedly over time. For example, sensor 302 can be calibrated each time when load 305 (e.g., a computer) is turned on, or periodically (e.g. every 100th start up), after the computer has been operated for a predetermined amount of time.

Figure 6:
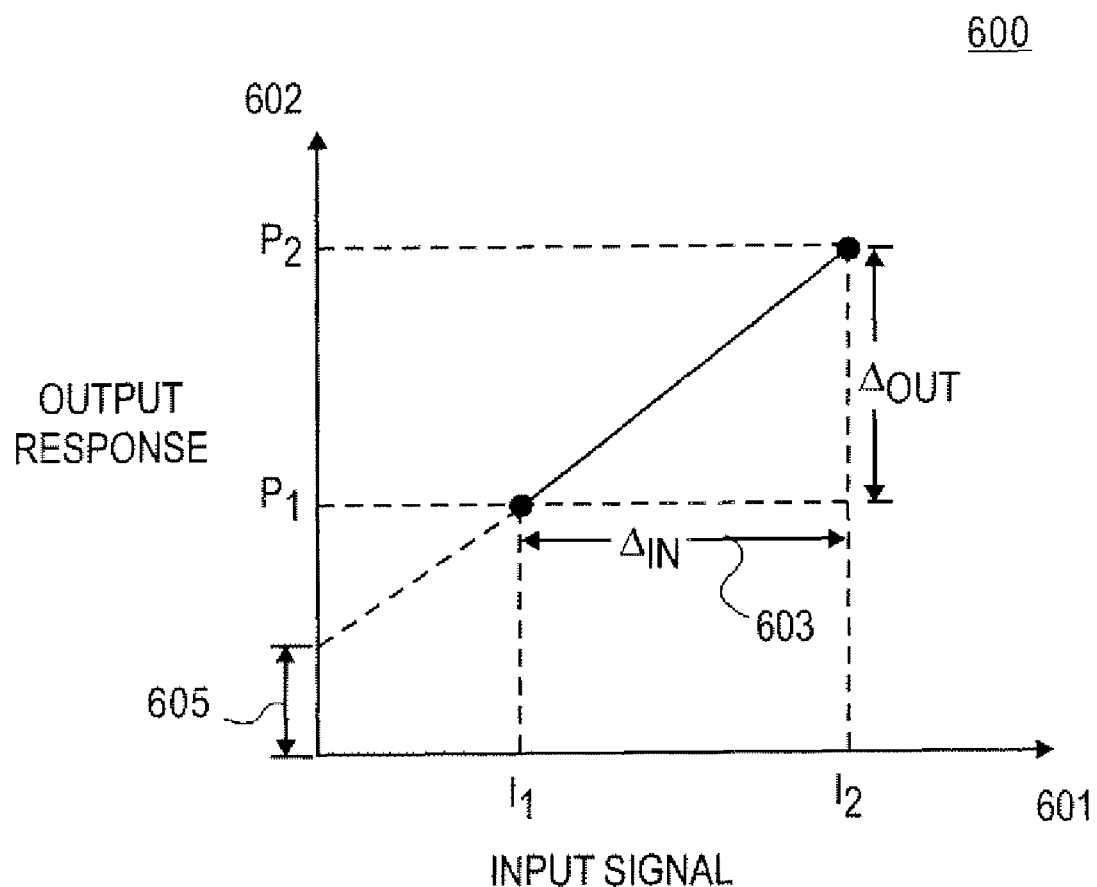
FIG. 6 graphically illustrates a method of solving a transfer function of an imprecise sensor according to one embodiment of the invention.

FIG. 6 graphically illustrates a method of solving a transfer function of an imprecise sensor according to one embodiment of the invention. Graph 600 shows output response 602 against input signal 601. Output response 602 at point P1 that corresponds to an unknown input signal $I_1$ is measured. Then a change in input signal 601 of known magnitude 603 is introduced, e.g., by an auxiliary circuit, as described above with respect to FIG. 3A. Output response 602 is moved from point P1 to point P2 in response to the change 603. Next, output response 602 at point P2 that corresponds to unknown input signal $I_2$ is measured. That is, the difference between output responses caused by the known change in the input signal is measured. The equation for the line passing through points P1 and P2 is the transfer function for the sensor. In one embodiment, the transfer function that maps output response 602 with input signal 601 is a linear function (straight line) (e.g., Ohm's law). In one embodiment, the transfer function has an offset 605. In another embodiment, the transfer function that maps output response 602 with input signal 601 is a non-linear function, e.g., a quadratic function, and a high-order polynomial function.

Figure 4:
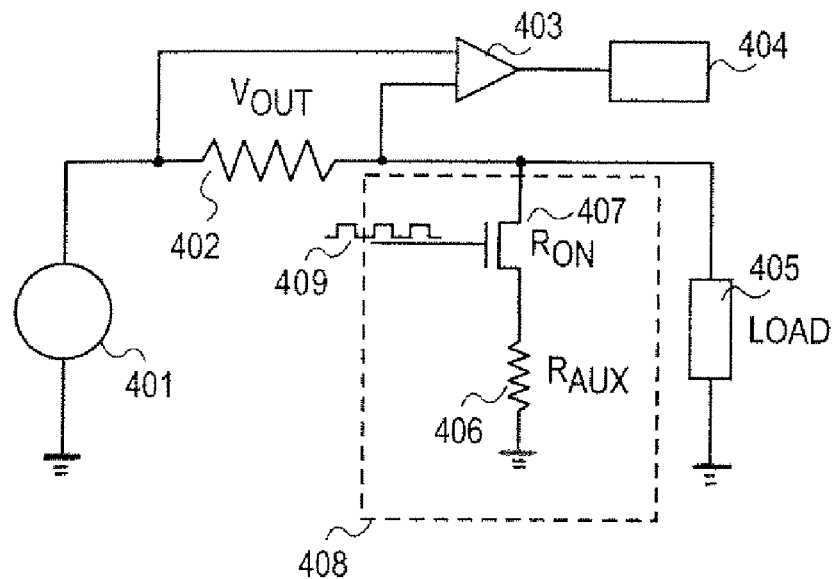
FIG. 4 shows another embodiment of a circuit to calibrate one or more imprecise sensors to monitor power.

FIG. 4 shows another embodiment of a circuit to calibrate one or more imprecise sensors to measure power. Circuit 400 includes voltage source 401 to provide an input signal through imprecise sensor 402 that has an inductance and a DCR resistance, as described above with respect to FIGS. 2 and 3A. Electronic load 408 that includes switch 407 drawn as a FET and auxiliary load 406 is coupled to sensor 402 to induce a fixed change in the input signal. Auxiliary load 406 has a fixed resistance $R_{aux}$, e.g., 10 Ohms, so that the input signal changes by a predetermined amount. In one embodiment, resistance $R_{on}$ of switch 407 is substantially smaller than $R_{aux}$. In another embodiment, resistance $R_{on}$ of switch 407 is known. As shown in FIG. 4, load 405 is coupled to sensor 402. Load 405 may be a main processor, e.g., a central processing unit ("CPU"), core logic, a graphic memory controller, graphics processor ("GPU"), main memory, microcontroller, a microprocessor, any other electronic load or any combination of these components. In one embodiment, the output response of sensor 402 is the potential difference (output voltage) across sensor 402 that is measured, e.g., by a voltmeter, while switch 407 is toggled to be enabled or disabled (turned "ON" and "OFF"). In another embodiment, the output response of sensor 402 is a duty cycle that is measured by a time measuring unit, e.g., a counter, while switch 407 is toggled "ON" and "OFF," as described in further detail below. In one embodiment, the output response is amplified by amplifier 403 and then measured and sampled by a sampler 404, e.g., by an analog-to-digital converter ("ADC"). As shown in FIG. 4, switch 407 is driven by a pulse 409, e.g., a 100 Hz square wave, to provide a statistically sufficient number of output response samples when switch 407 is "ON" and "OFF".

Figure 7A:
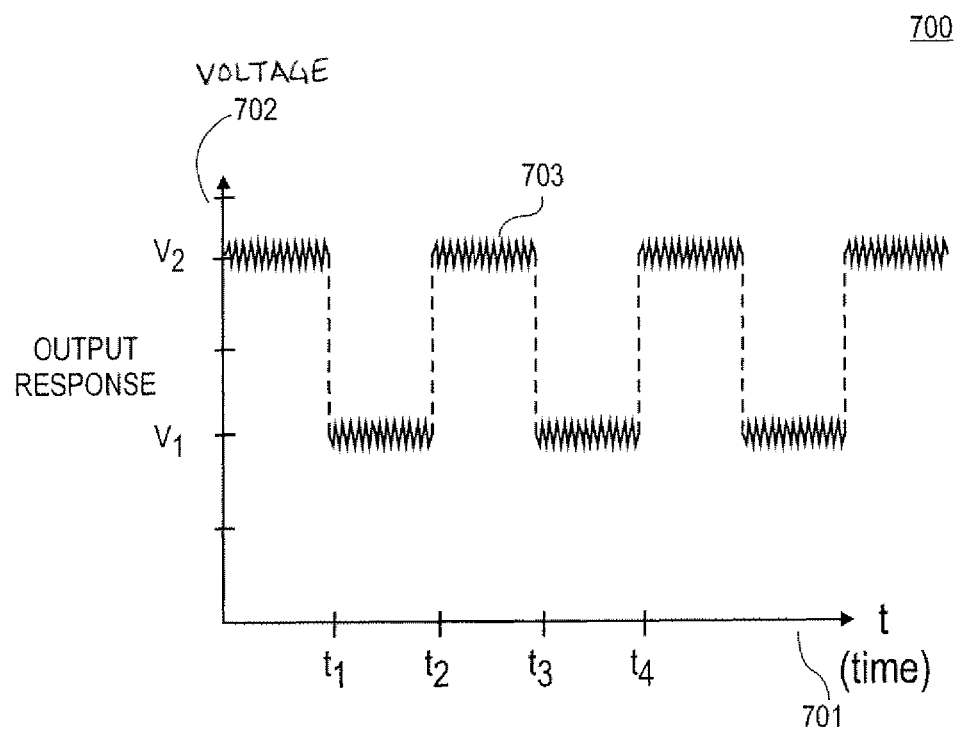
FIG. 7A shows an output response signal across an imprecise sensor sampled by a sampler against time according to one embodiment of the invention.

FIG. 7A shows an output response signal (e.g., voltage) across an imprecise sensor 402 sampled by a sampler 404 against time according to one embodiment of the invention. As shown in FIG. 7A, the original, noisy output response signal appears at level V1, and the augmented noisy output response signal appears at level V2. In one embodiment, measuring and sampling of the output response signal across sensor 404 is not synchronized with changing of the input signal. For example, if the switch 407 is driven by a 100 Hz rectangular wave signal, this signal (in an unsynchronized embodiment) is not synchronized to the sampling of the output response (e.g. V2 and V1 shown in FIG. 7A). Therefore, the samples of the output response signal do not contain the information about the time when they are taken relative to the operation of a switch 407. That is, sampler 404 does not have a priori information about the categories (switch 407 "ON" or "OFF") to which the samples belong. Such samples are said to be unlabeled.

Figure 12:
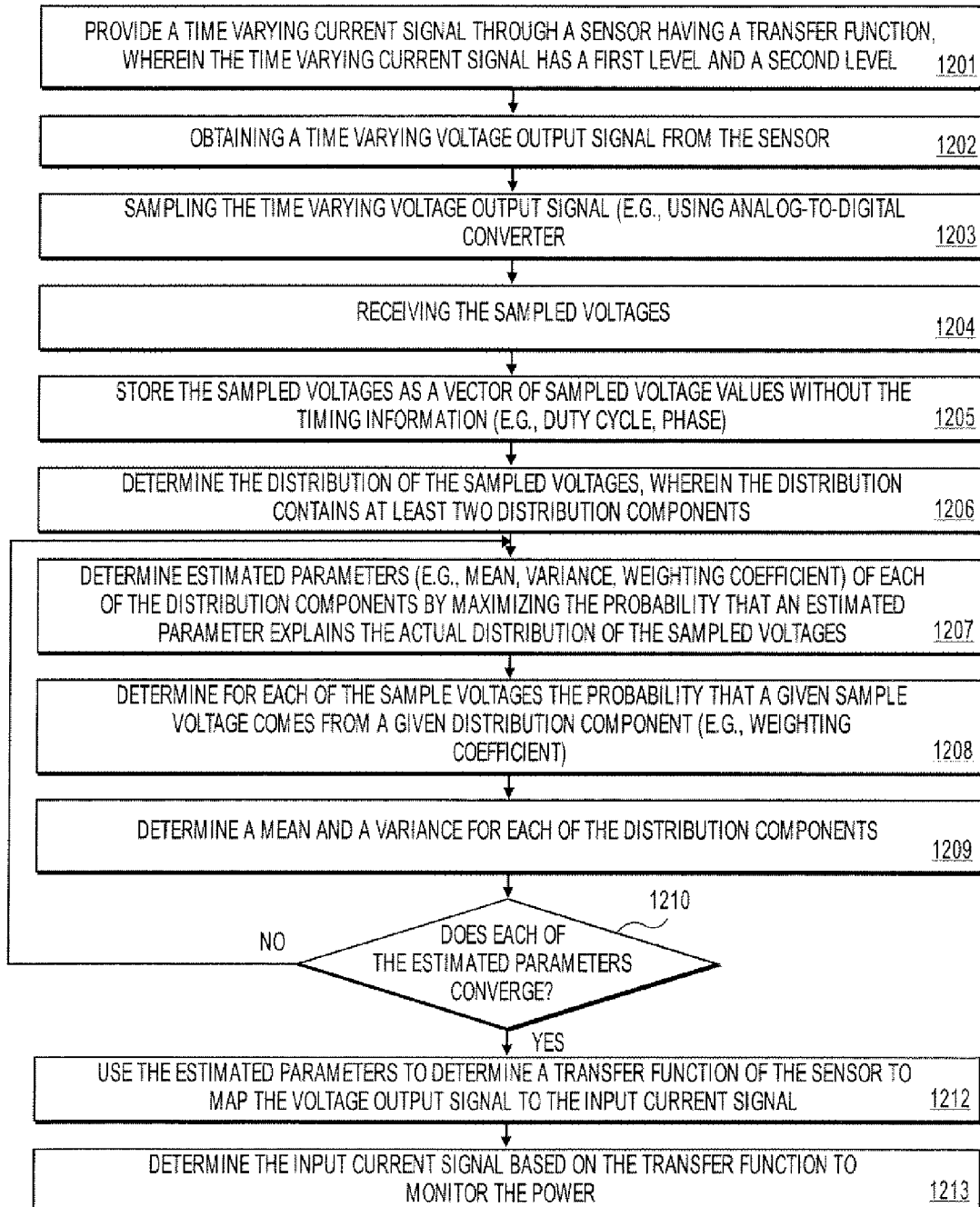
FIG. 12 is a flowchart of one embodiment of a method to calibrate an imprecise sensor for power monitoring.

FIG. 12 is a flowchart of one embodiment of a method to calibrate an imprecise sensor for power monitoring. Method begins with operation 1201 of providing a time-varying current signal through a sensor having a transfer function, wherein the time-varying current signal has a first level and a second level, as described above with respect to FIGS. 2, 3A, and 4. The method continues with operation 1202 of obtaining a time-varying voltage output signal from the sensor, as described above with respect to FIGS. 2, 3A, and 4. Next, operation 1203 involving sampling the time-varying voltage output signal is performed, e.g., by a ADC as described above with respect to FIGS. 4 and 7A.

Figure 7B:
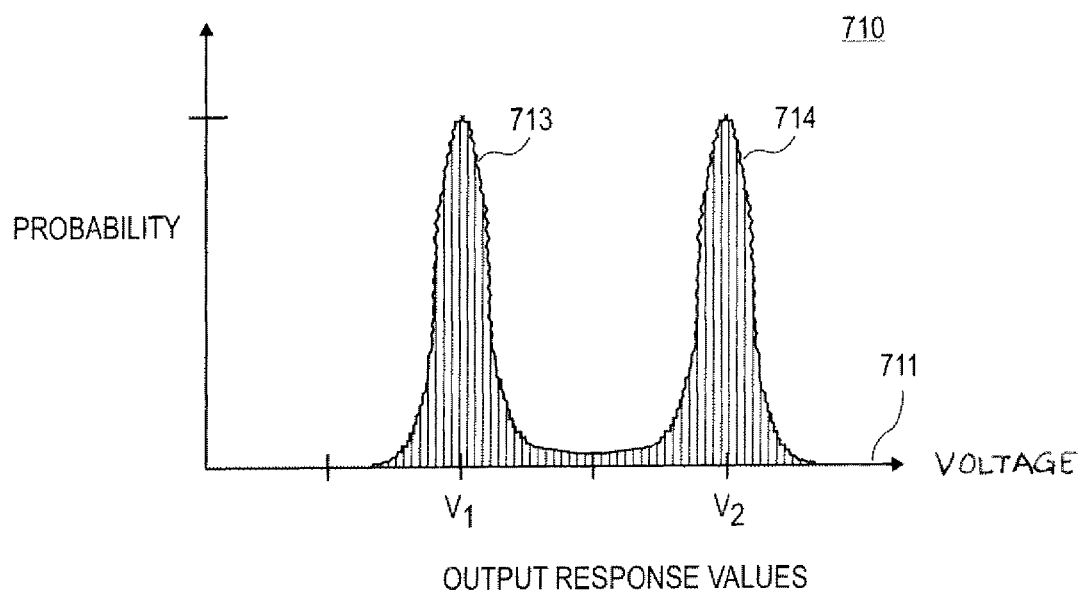
FIG. 7B shows a probability distribution of unlabeled samples of output response signals stored in the memory according to one embodiment of the invention.

FIG. 7B shows a simplified diagram illustrating a probability distribution 710 of unlabeled samples of output response signal (e.g., voltage) 711 stored in the memory according to one embodiment of the invention. In one embodiment, the probability distribution of the unlabeled samples is an actual observed distribution of sample values. As shown in FIG. 7B, the distribution 710 contains at least two distribution components ("modes") 713 and 714, which correspond to an original signal and to a changed ("augmented") output response signal respectively. Samples of mode 713 are clustered around level V1, and samples of mode 714 are clustered around level V2, as shown in FIG. 3B. Because the output signal is noisy, the tails of each of distribution components 713 and 714 may overlap, as shown in FIG. 7B. In one embodiment, sample values are voltages. In another embodiment, sample values are duty-cycle values, as described in further detail below.

Referring back to FIG. 12, at operation 1204, the sampled voltages are received. Next, in operation 1205 the sampled voltages are stored in a memory, as described above with respect to FIG. 7B. In one embodiment, the sampled voltages are stored in a memory as a vector of sampled voltage values, or magnitudes, that are expressed, e.g., in units of volts, without any timing information (e.g., arrival time to a sampler, order of arrival, duty cycle, phase). Next, operation 1206 is performed that involves determining (obtaining and recognizing) the distribution of the sampled voltages, wherein the distribution contains at least two distribution components, as described with respect to FIGS. 7B and 7C.

Figure 7C:
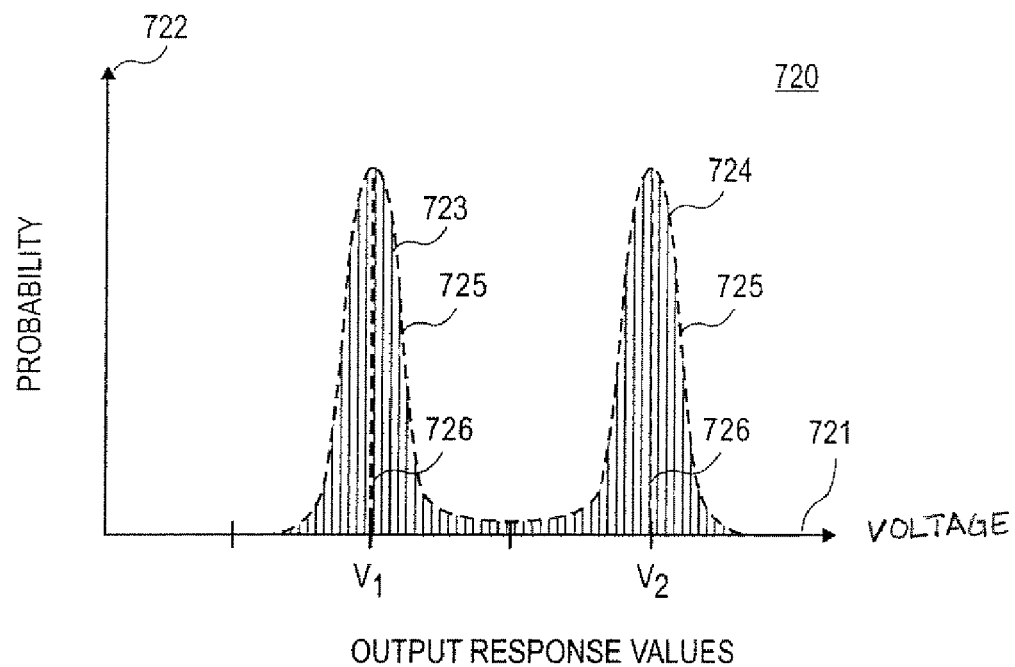
FIG. 7C shows a probability distribution of sample values after fitting samples to a distribution model according to one embodiment of the invention.

FIG. 7C shows probability distribution 720 of sample values after fitting samples of output response signal (e.g., voltage) 721 to a distribution model according to one embodiment of the invention. Distribution model 725 that fits to the probability distribution of measured sample values 726 is shown on FIG. 7C as a dotted line. Distribution model 725 has at least two distribution components. In one embodiment, distribution model 725 is a Gaussian Mixture Model that has at least two overlapping Gaussian distribution components 723 and 724. In another embodiment, the distribution model that fits the probability distribution of measured sample values has three or more distribution components.

Referring back to FIG. 12, operation 1207 is performed that involves determining estimated parameters of each of the distribution components.

Referring back to FIG. 7C, in one embodiment, parameters of each of the distribution components 723 and 724 include a mean value $\mu$, a variance $\sigma^2$, and a weighting coefficient $\alpha$. Weighting coefficient $\alpha$ describes the probability that a sample comes from one of the distribution components 723 and 724. That is, for a particular distribution component weighting coefficient $\alpha$ describes the probability that any given sample was drawn from that component. In one embodiment, parameters of each of the distribution components 723 and 724 are estimated using a statistical iterative algorithm by maximizing the probability $p(\theta|x)$ that an estimated parameter $\theta_j$ explains actual samples X. In one embodiment, the statistical iterative algorithm is an Expectation Maximization ("EM") algorithm that is used to determine the parameters of distribution components 723 and 724. The EM algorithm finds the most likely parameters $\theta_j=(\alpha_j, \mu_j, \sigma_j^2)$ for each of distribution components j=1, . . . J, given the input samples X, $p(\theta|x)$. In one embodiment, an initial original output response (e.g., a voltage) of imprecise sensor 402 is measured and stored in a memory during the manufacturing of the system. In one embodiment, this initial original output response of sensor 402 is used to determine initial estimated parameters in the EM algorithm.

Referring back to FIG. 4, in one embodiment, when a rectangular-wave signal having a frequency in the approximate range of 10 Hz to 200 Hz, is applied to switch 407, j=1, 2. The probabilities that a sample comes from a component j follow the duty cycle. For example, if duty cycle is 50%, where half the time samples are at the low voltage level, and the other half the time samples are at the high voltage level, $\alpha_j$ is 0.5 for j=1, 2. The remaining parameters are the estimated mean $\mu_j$ and variance $\sigma^2_j$ for each of distribution components 723 and 724, as shown in FIG. 7C.

Rather than directly maximize the objective function p(θ|x), EM algorithm maximizes a lower bound to this function. The EM algorithm alternately computes this lower bound (the "E-step"), and then maximizes the bound ("M-step"). In the E-step, for each sample $x_j$ the likelihood is determined that the sample $x_j$ is drawn from component j given current estimates θ. Then, in the M-step, the $\theta_j$ are updated based on new $\alpha_j$ estimates of the samples to components j. The process repeats until the parameters $\theta_j=(\alpha_j, \mu_j, \sigma_j^2)$ sufficiently converge. EM algorithm is described in further detail below.

Maximizing the lower bound is a straightforward way to maximize the objective function p(θ|x). In the general form, the lower bound is a function g(θ, q(h)), where q(h) contains distributional information about some unknown parameters. For example, the unknown parameters may be the assignments of the samples to the Gaussian components. Since g is a lower bound, p(x, θ)≧g(θ, q).

Typically, EM is expressed as maximizing the logarithm of the bound, G:

$$G(\theta,q)=\log g(\theta,q)=\int_h q(h)\log p(x,h,\theta) - q(h)\log q(h) \quad (4)$$

In the E-step, a q is chosen so that to satisfy the following expression:

$$q(h)=p(h|x,\theta) \quad (5)$$

Then, in the M-step, q is inserted into the expression for G (4), and G is maximized over the possible values of θ.

In the specific case of EM for a Gaussian mixture with M component Gaussians and n=|x|, q simplifies to an M×n matrix such that:

$$q_{ji}=p(j|i)=p(y_i=j|x_i,\theta) \quad (6)$$

where $y_i$ is the assignment of sample i to component j. The E-step therefore comprises of populating this matrix based on the current estimate of θ.

The M-step chooses a new θ based on the updated q matrix. This θ should maximize:

$$\sum_{ji} q_{ji} \log p(x_i, y_i=j, \theta) \quad (7)$$

Informally, the new $\theta_j$s should be those which "best" summarize the components using our current assignments of samples i to components j, $q_{ji}$. In other words, the new $\alpha_j$ should be the estimated fraction of samples belonging to component j. The new $\mu_j$ and $\sigma^2_j$ are the new Gaussian parameters based on the estimated population of j. Let $n_j$ be the "soft number of examples labeled j."

$$n_j = \sum_{i=1}^{n} p(j|i) \quad (8)$$

The new mixture probability is therefore:

$$\alpha_j = \frac{n_j}{n} \quad (9)$$

The updated mean and variance are:

$$\mu_j = \frac{1}{n_j} \sum_{i=1}^{n} p(j|i) x_i \quad (10)$$

$$\sigma_j^2 = \frac{1}{n_j} \sum_{i=1}^{n} p(j|i)(x_i - \mu_j)^2 \quad (11)$$

The new $\theta_j$s are then used for the E-step in the next iteration of the algorithm. The iteration is continued until the elements of the $\theta_j$s sufficiently converge. In one embodiment, the convergence is defined as:

$$\frac{|\alpha_j - \alpha_{j-1}|}{\alpha_j} \leq \text{threshold and} \quad (12)$$

$$\frac{|\mu_j - \mu_{j-1}|}{\mu_j} \leq \text{threshold and} \quad (13)$$

$$\frac{|\sigma_j^2 - \sigma_{j-1}^2|}{\sigma_j^2} \leq \text{threshold} \quad (14)$$

In one embodiment, the estimated parameters sufficiently converge in less than ten iterations given initial estimates of the parameters $\theta_j$.

Referring back to FIG. 12, operation 1208 is performed that involves determining for each of the sample voltages (values) the probability that a given sample voltage comes from a given distribution component (e.g., a weighting coefficient). Next, method 1200 continues with operation 1209 that involves determining a mean and a variance for each of the distribution components, as described above. Next at operation 1210, a decision is made whether the estimated parameters sufficiently converge. If the estimated parameters do not sufficiently converge, operations 1207-1209 repeat. If the estimated parameters sufficiently converge, method 1200 continues with operation 1211 that involves using the estimated parameters to determine a transfer function of the sensor to map the output signal (e.g., voltage) to an input signal (e.g., current). Next, operation 1212 is performed that involves determining the input signal (e.g., input current) through a load coupled to the sensor to monitor the power.

Referring back to FIG. 4, as long as load 405 draws current in a way that is distributionally the same whether switch 407 is "ON" or "OFF," method 1200 can be used. In one embodiment, sensor 402 is calibrated periodically, to always have an estimate of the transfer function which reflects current conditions of the system. In one embodiment, during the calibration of sensor 402, variations of the load 405 are minimized.

Figure 7D:
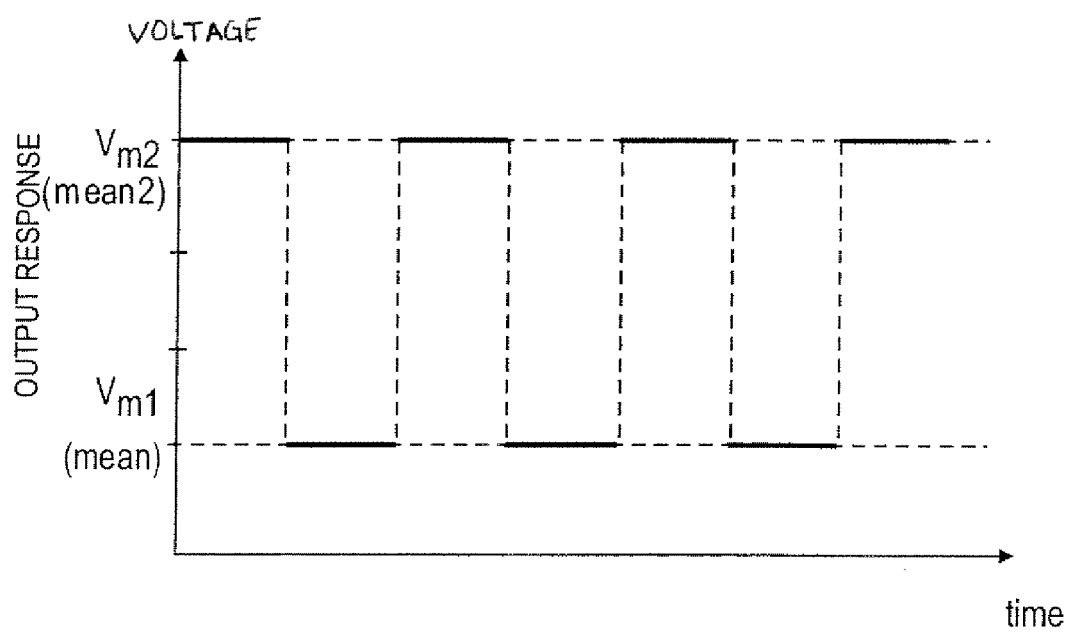
FIG. 7D shows calculated mean values $\mu_j$ for each of the distribution components against time according to one embodiment of the invention.

FIG. 7D shows calculated mean values $\mu_j$ for each of the distribution components against time according to one embodiment of the invention.

As shown in FIG. 7D, mean values $V_{m1}$ and $V_{m2}$ best summarize the distributions of output response signal (e.g., voltage) values before and after changing the input signal. Additionally, mean values $V_{m1}$ and $V_{m2}$ are used to filter out the noise that may be a result of natural variation in the input signal and the noise that may be inherent in the sampling process.

In one embodiment, mean values $V_{m1}$ and $V_{m2}$ and a predetermined change in the input signal are used to determine a transfer function of a sensor. In one embodiment, the transfer function of the sensor is calculated as a ratio between a difference of mean values $V_{m1}$ and $V_{m2}$ to a predetermined change in the input signal ($\Delta I$).

Figure 5:
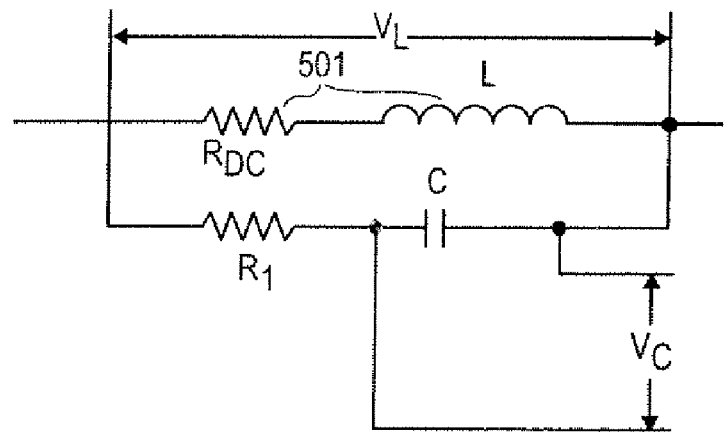
FIG. 5 shows another embodiment of a circuitry to extract a resistive component of an imprecise sensor.

FIG. 5 shows one embodiment of a circuitry to extract a DCR component of an imprecise sensor. The imprecise sensor 501 has a DC resistance $R_{DC}$ and a frequency-varying resistive component, e.g., inductance L. Resistor R1 and capacitor C are connected in parallel to imprecise sensor 501.

Voltage $V_L$ across imprecise sensor 500 is determined approximately as follows:

$$V_L \cong I_L(R_{DC} + s \times L) \quad (15),$$

wherein $I_L$ is current through imprecise sensor 501, s×L is a complex impedance.

Current $I_{RC}$ through resistor $R_1$ and capacitor C is determined as follows:

$$I_{RC} \cong \frac{V_L}{\left(R_1 + \frac{1}{s \times C}\right)}. \quad (16)$$

The voltage $V_c$ across capacitor C is determined as follows:

$$V_c \cong \frac{I_{RC}}{s \times C}. \quad (17)$$

Then, $$V_c = \frac{I_L(R_{DC} + s \times L)}{R_1 + \frac{1}{s \times C}} \times \frac{1}{s \times C} = \frac{I_L(R_{DC} + s \times L)}{1 + R_1 \times s \times C}; \quad (17.1)$$

$$V_c = \frac{I_L\left(1 + s\frac{L}{R_{DC}}\right) \times R_{DC}}{1 + s \times R_1 \times C} \quad (17.2)$$

If the values of resistor $R_1$ and capacitor C are selected such that a product of resistor $R_1$ and capacitor C is equal to a ratio of inductance L to DC resistance, as follows:

$$R_1 \times C = \frac{L}{R_{DC}} \quad (18)$$

then, by measuring voltage $V_c$ across capacitor C, DC resistance can be extracted, i.e., $V_c = I_L \times R_{DC}$ \quad (18.1)

Figure 8A:
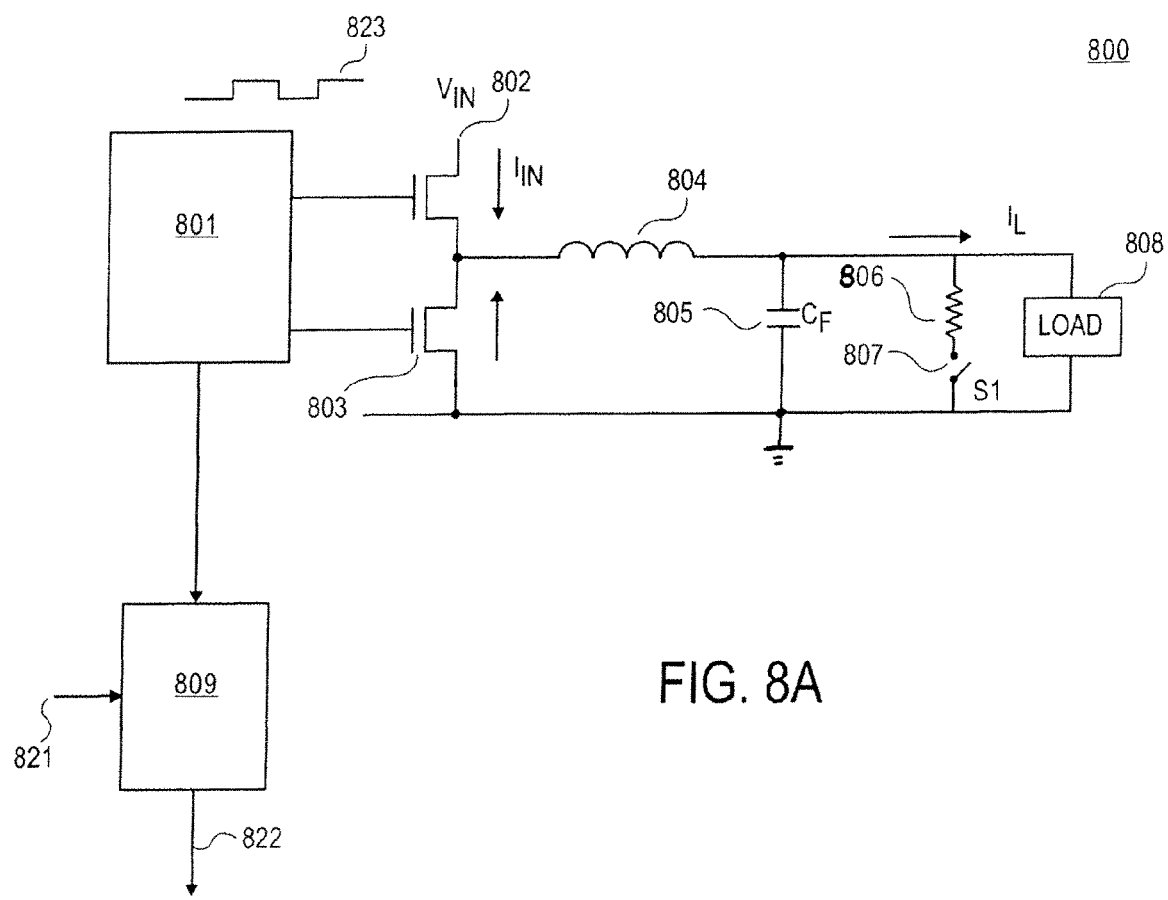
FIG. 8A shows one embodiment of a switching regulator to calibrate an imprecise sensor for power monitoring.

FIG. 5A shows one embodiment of a switching regulator 800 to calibrate an imprecise sensor for power monitoring. As shown in FIG. 8A, a time-varying input signal 823 with a duty cycle (e.g., a rectangular wave) controlled by controller 801 is provided through switching transistors 802 and 803 to inductor 804. An auxiliary circuit that includes switch 807 (S1) and resistor 806 having a fixed resistance is coupled to induce a change in the input signal through inductor 804. Load 808, e.g., a processor, is connected in series to inductor 804, as shown in FIG. 8A. The input signal through inductor 804 (e.g., duty cycle) is measured while switch 807 is toggled "ON" and "OFF". In one embodiment, switch 807 is toggled "ON" and "OFF" by a pulse signal at a certain frequency to induce a change in the input current during a relatively small time interval, as described above with respect to FIG. 4. The switching regulator 800 operates such that the duty cycle of the input signal through the sensor is proportional to the level of the current flown through inductor 804. When switch 807 is turned "ON", controller 801 increases the duty cycle of the input signal to compensate for decreasing a voltage. As shown in FIG. 8A, the duty cycle of the input signal through the sensor is measured digitally (e.g., in nanoseconds) by a high-frequency counter 809. In one embodiment, the duty cycle can be derived using digital counter 809 by comparing counts of samples (taken at a fixed, high frequency) at each logic level. In one embodiment, high-frequency counter 809 is enabled by clock 821, as shown in FIG. 8A. In one embodiment, operation of high-frequency counter 809 is not synchronized with operation of switch 907. High-frequency counter 809 outputs the duty-cycle values, while switch 807 is toggled "ON" and "OFF," to a microcontroller, a microprocessor (not shown), and/or to a memory (not shown) for further processing to determine a transfer function of inductor 804, as described above with respect to FIGS. 7A-7D.

Figure 8B:
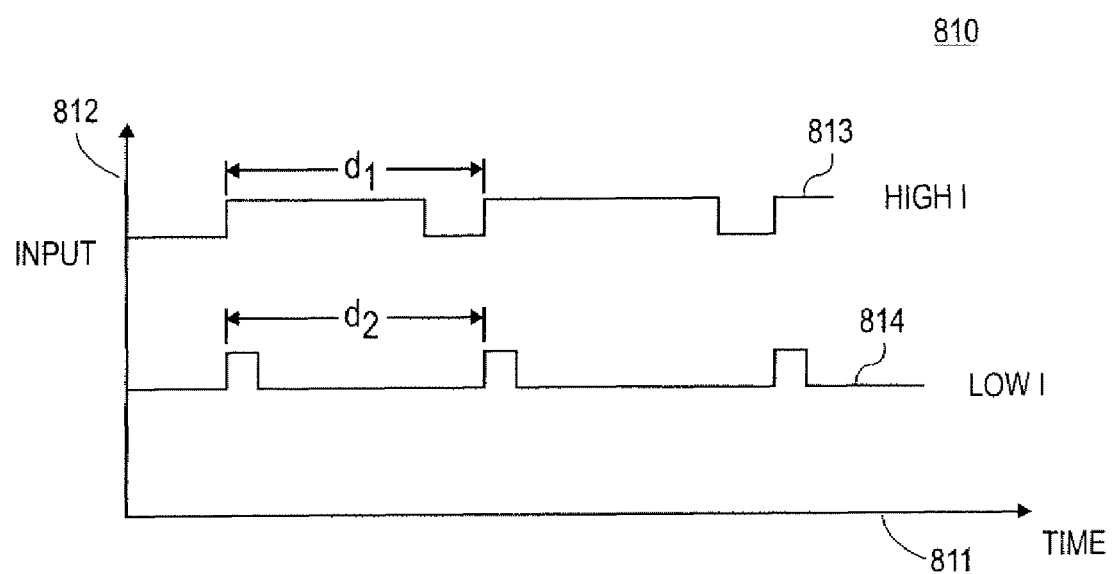
FIG. 8B shows waveforms of the input signal through an imprecise sensor against time while switch is toggled "ON" and "OFF"

FIG. 8B shows waveforms of the input signal 812 through inductor 804 versus time 811 while switch 807 is toggled "ON" and "OFF". As shown in FIG. 8B, waveform 813 having a larger duty cycle $d_1$, e.g., 90%, corresponds to a high current level. Waveform 814 having a smaller duty cycle $d_2$, e.g., 10%, corresponds to a low current level.

Figure 13:
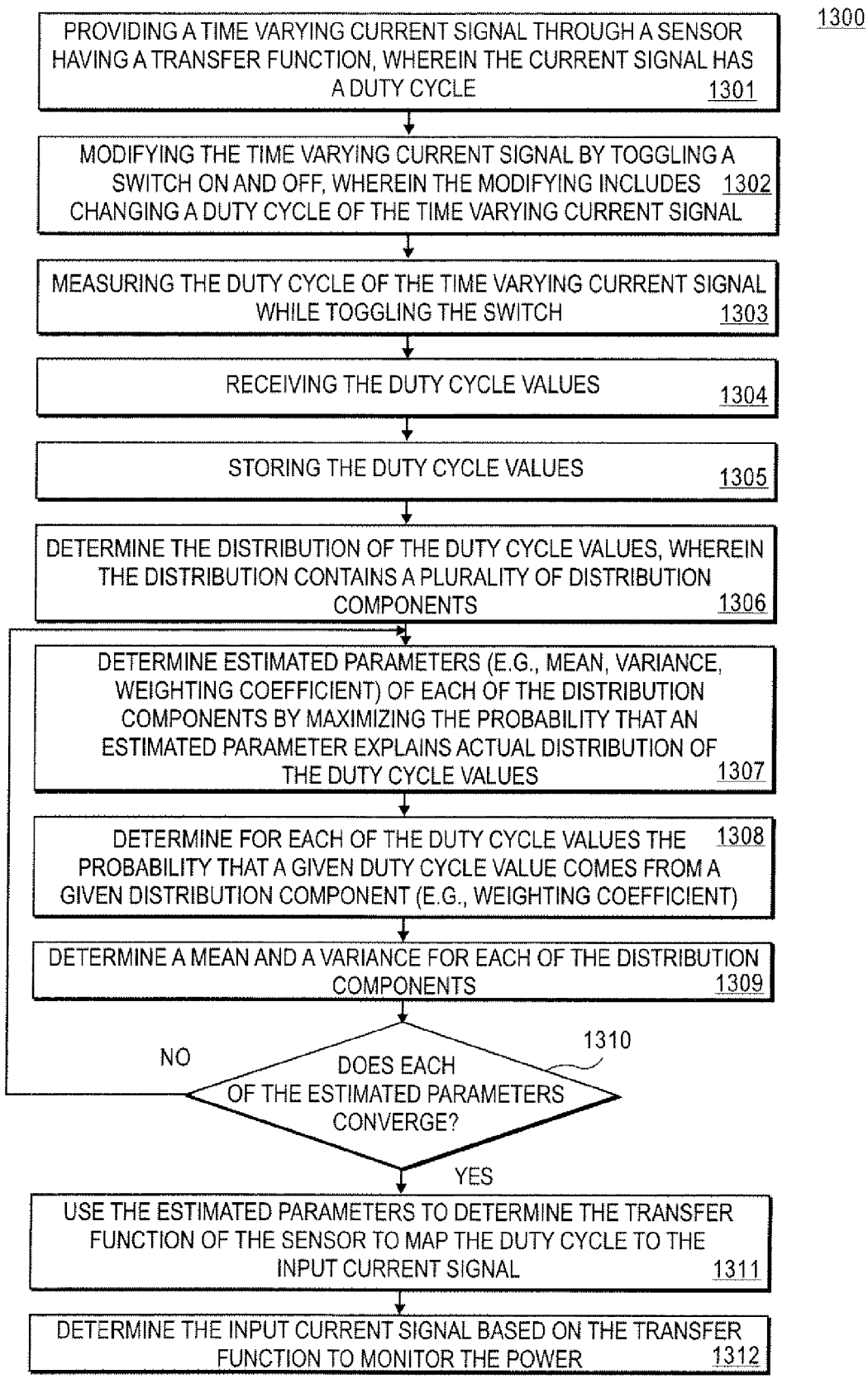
FIG. 13 is a flowchart of one embodiment of a method to calibrate an imprecise sensor for power monitoring.

FIG. 13 is a flowchart of one embodiment of a method to calibrate an imprecise sensor for power monitoring. Method begins with operation 1301 of providing a time-varying current signal through a sensor having a transfer function, wherein the time-varying current signal has a duty cycle, as described above with respect to FIG. 8. The method continues with operation 1302 of modifying the time-varying current signal by toggling a switch "ON" and "OFF", wherein the modifying includes changing a duty cycle of the time-varying current signal, as described. Next, at operation 1303, the duty cycle of the time-varying current signal is measured by a counter, while toggling the switch, above with respect to FIGS. 8A and 8B. In operation 1304, the duty-cycle values are received. Next, in operation 1305 the duty-cycle values are stored in a memory, as described above with respect to FIG. 7B. Further, operation 1306 is performed that involves determining (obtaining and recognizing) the distribution of the duty-cycle values, wherein the distribution contains at least two distribution components, as described with respect to FIGS. 7B and 7C. Next, operation 1307 is performed that involves determining estimated parameters of each of the distribution components. Next operation 1308 is performed that involves determining for each of the duty-cycle values the probability that a given duty-cycle value comes from a given distribution component (e.g., a weighting coefficient). Next, method 1300 continues with operation 1309 that involves determining a mean and a variance for each of the distribution components, as described above with respect to FIGS. 7A-7D. Next at operation 1310, a decision is made whether the estimated parameters sufficiently converge. If the estimated parameters do not sufficiently converge, operations 1307-1309 repeat. If the estimated parameters sufficiently converge, method 1300 continues with operation 1311 that involves using the estimated parameters to determine a transfer function of the sensor to map the duty cycle to an input signal. In one embodiment, estimated parameters, e.g., mean values of duty cycles are calculated, as described above with respect to FIG. 7D. The difference between mean duty-cycle values before and after the input signal is changed are used to determine a conversion factor (transfer function) between the duty-cycle value and current. For example, if the mean value of the duty cycle is changed by 3 microseconds ("usec") while the current is changed by 1 amp., the conversion factor is 3 usec/amp. Next, operation 1312 is performed that involves determining the input signal (e.g., input current) through load 808 based on the transfer function, to monitor the power.

Figure 9:
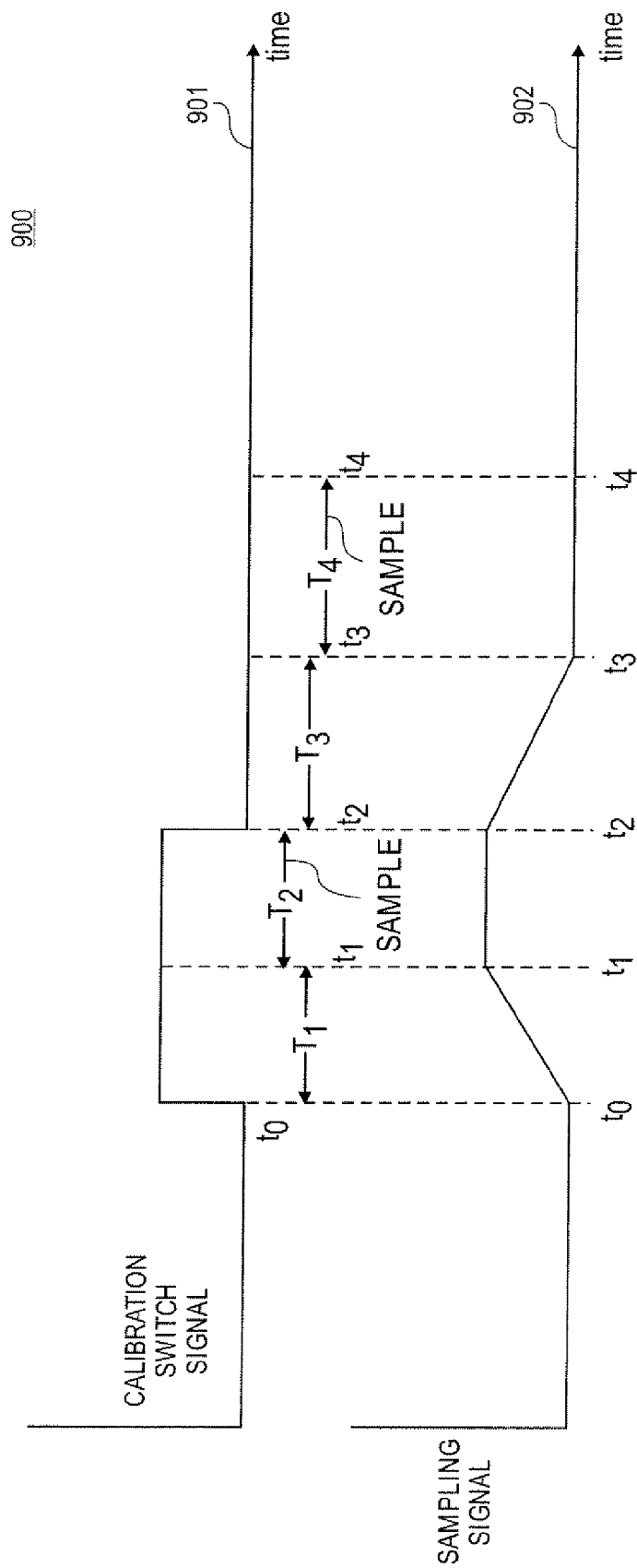
FIG. 9 illustrates one embodiment of a method to calibrate an imprecise sensor using synchronization of the sampling time with an operation of a switch.

FIG. 9 illustrates one embodiment of a method to calibrate imprecise sensor using synchronization of the sampling time with an operation of a switch. FIG. 9 shows a calibration switch signal 901 and sampling signal 902 versus time. Referring back to FIG. 4, operation of electronic load 408 that includes switch 407 and auxiliary load 406 is synchronized with operation of sampler 404. In one embodiment, a microcontroller (not shown) is coupled to electronic load 408 and to sampler 404 to control and synchronize the switching time and the sampling time. In one embodiment, the microcontroller (not shown) is incorporated into electronic load 408 to control and synchronize the switching time and the sampling time. In another embodiment, the microcontroller (not shown) is incorporated into sampler 404 to control and synchronize the switching time and the sampling time.

As shown in FIG. 9, at time to the calibration switch signal enables the switch 407 to induce a predetermined change in the input signal, as described above with respect to FIGS. 3 and 4. Sampling of the output response of the sensor is delayed for a period of time $T_1$, e.g., in the approximate range of 5-10 milliseconds, to stabilize the current through the sensor after the auxiliary load is applied. Sampling begins after the delay at time $t_1$ to obtain applied load samples.

As shown in FIG. 9, sampling is performed during time period $T_2$, e.g., in the approximate range of 5-10 milliseconds, to obtain samples while the switch is enabled. In one embodiment, during time interval $T_2$ a relatively small number of samples is taken, e.g., about 5-10 samples. At time $t_2$ calibration switch signal disables the switch (e.g. opens the switch so no current flows through the auxiliary lead 406), as shown in FIG. 9. Sampling of the output response of the sensor is delayed for a period of time $T_3$, e.g., in the approximate range of 5-10 milliseconds, to stabilize the current after the switch is disabled. Sampling begins after the delay $T_3$ at time $t_3$ to obtain "non-loaded" samples. As shown in FIG. 9, sampling is performed from time $t_3$ during period of time $T_4$, e.g., in the approximate range of 5-10 milliseconds, while the switch is disabled. In one embodiment, during time interval $T_4$ a relatively small number of samples is taken, e.g., about 5-10 samples. A mean value of the applied load samples and a mean value of the "non-loaded" samples is calculated. In one embodiment, the difference of the mean values of the applied load samples and "non-loaded" samples is calculated with different number and size (in duration) of samples in order to obtain an intermediate current difference, which only shows the difference based on inducing a fixed auxiliary load and filters out other external factors of the circuit (e.g., related to CPU, GPU, or memory activity) that may cause the difference to fluctuate, as described in further detail below.

Figure 14:
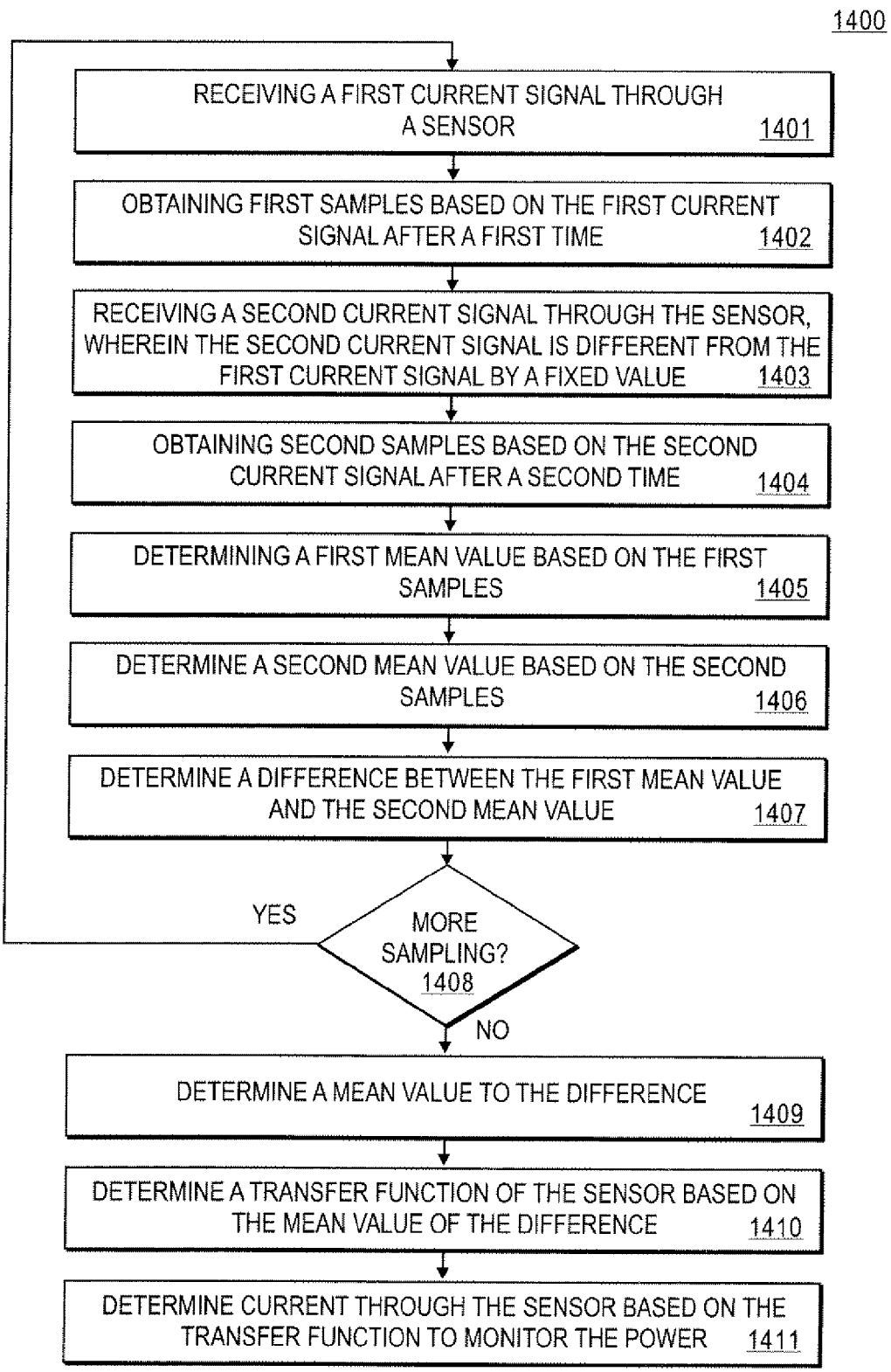
FIG. 14 is a flowchart of one embodiment of a method to calibrate imprecise sensor using synchronization of the sampling time with an operation of a switch.

FIG. 14 is a flowchart of one embodiment of a method to calibrate imprecise sensor using synchronization of the sampling time with an operation of a switch. Method 1400 begins with operation 1401 of providing a first current signal through a sensor, as described above with respect to FIGS. 3A and 4. At operation 1402, first set of samples are obtained after a first period of time, as described with respect to FIG. 9. Next, at operation 1403, a second current signal through the sensor is received, wherein the second current signal is different from the first current signal by a fixed value, as described above with respect to FIGS. 3A and 4. Method 1400 continues with operation 1404 that involves obtaining second set of samples based on the second current signal after a second period of time, as described above with respect to FIG. 9. Next, operation 1405 is performed involving determining a first mean value based on the first set of samples. Further, operation 1406 is performed involving determining a second mean value based on the second set of samples. Next, a difference between the first mean value and the second mean value is calculated at operation 1407. Next, at operation 1408, if more sampling is required to determine a difference, operations 1401-1407 repeat. In one embodiment, a first set of samples and the second set of samples contain a relatively small number of samples. Repeatedly calculating first and second mean values for a relatively small number of samples, and then calculating the difference of these mean values is performed to filter out external fluctuations in the circuit load caused, e.g., by a CPU, a GPU, and a memory. In one embodiment, operations 1401-1407 are continuously repeated until a variance (or standard deviation value) of the differences of the first and second mean values is minimized. In one embodiment, operations 1401-1407 are repeated to more precisely determine the difference in the mean values to determine a transfer function of a sensor, as described above.

Next, if more sampling is not required, the method continues at operation 1409 that involves determining a mean value of the difference between mean values of first set of samples and the second set of samples. Next, at operation 1410, a transfer function of the sensor is determined based on the mean value of the difference, as described above with respect to FIGS. 3, 4, 6, and 7. Further, operation 1411 is performed that involves determining current through a load coupled to the sensor based on the transfer function, to monitor the power, as described above with respect to FIGS. 3, 4, and 6.

Figure 10:
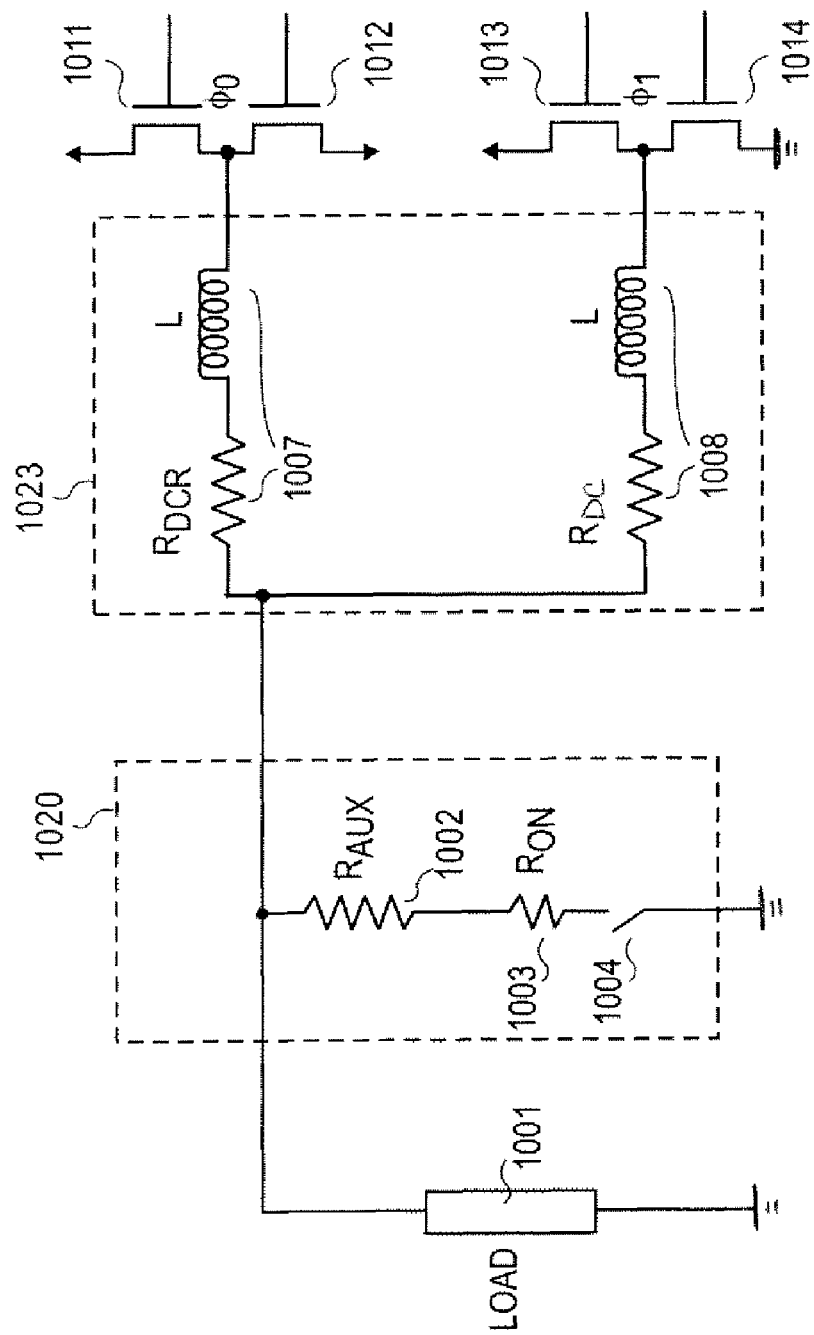
FIG. 10 shows one embodiment of a system to calibrate an imprecise sensor to monitor the power.

FIG. 10 shows one embodiment of a system 1000 to calibrate an imprecise sensor to monitor the power. As shown in FIG. 10, a multiple phase power supply provides a current through load 1001 through switches 1011 and 1012 of a first phase rail (φ0), and switches 1013 and 1014 of a second phase rail (φ1). As shown in FIG. 10, switched load circuit 1020 connected in parallel between load 1001, e.g., a CPU, a GPU, a memory, or a combination of these components and imprecise sensors 1022 to induce a predetermined change in the current, as described above with respect to FIGS. 3A and 4. The first phase rail is connected to imprecise sensor 1007, and the second phase rail is connected to imprecise sensor 1008. Each of the imprecise sensors 1007 and 1008 has a DC resistance $R_{DC}$, and an inductance L. The transfer function is determined for each of the imprecise sensors 1007 and 1008, as described above with respect to FIGS. 3B, 12, 13, and 14. In one embodiment, the current flown through each of the imprecise sensors is calculated based on the transfer function of each of the sensors 1007 and 1008. Then, the current flown through each of the sensors 1007 and 1008 is summed up to determine the current through load 1001.

Figure 1:
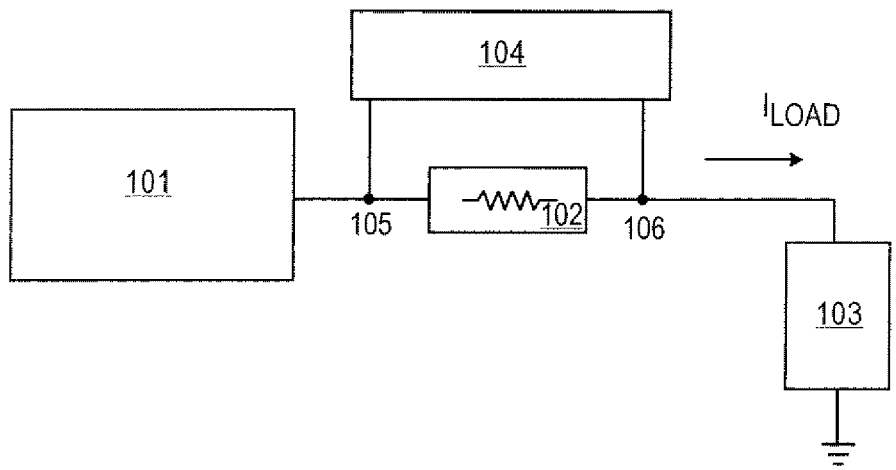
FIG. 1 illustrates a typical computer system that uses a precise sensor for power monitoring.
Figure 11:
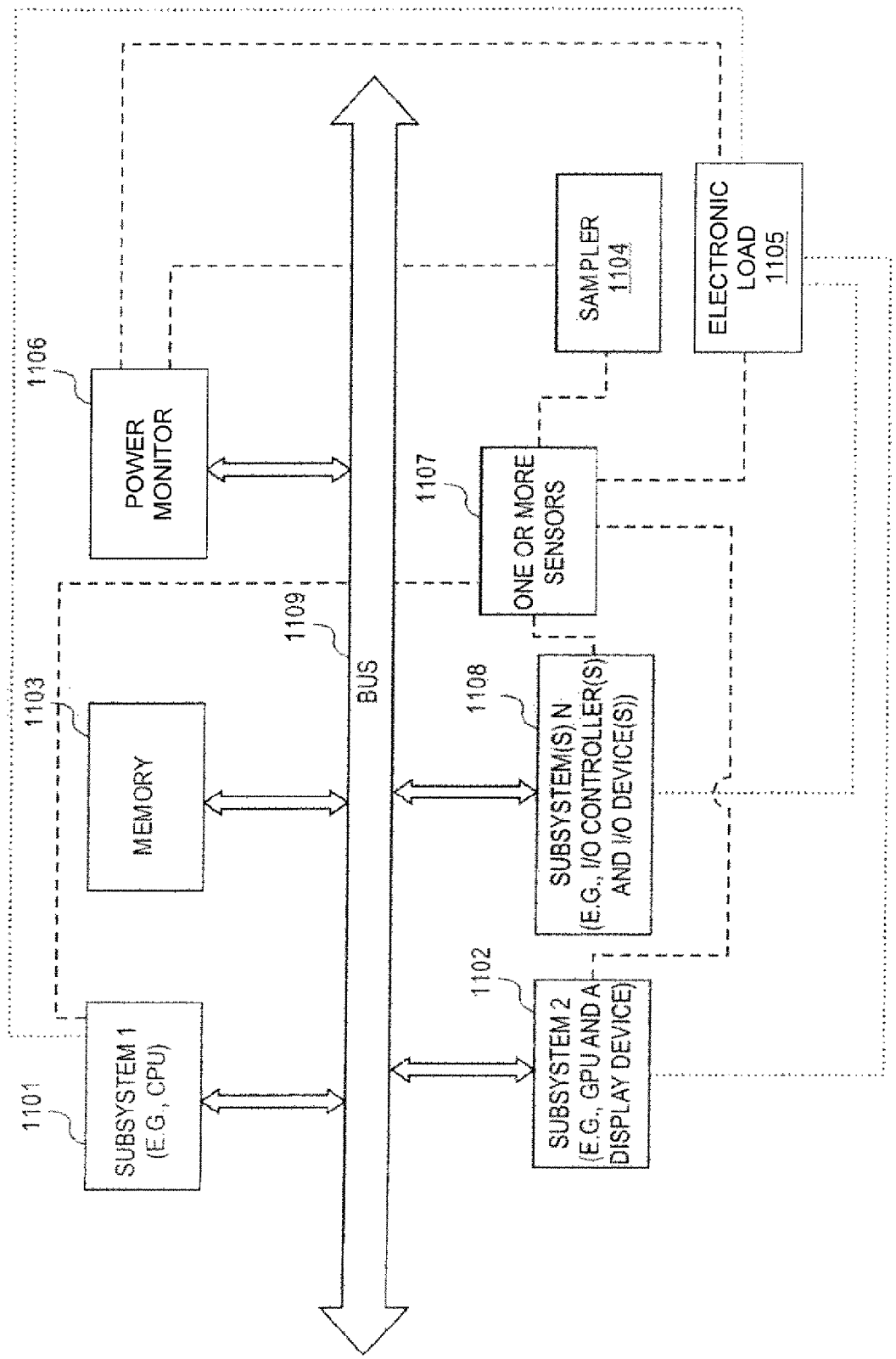
FIG. 11 illustrates one embodiment of a data-processing system having one or more imprecise sensors to monitor the power usage in the data-processing system.

FIG. 11 illustrates one embodiment of a data-processing system having one or more imprecise sensors to monitor the power usage. As shown in FIG. 11, system 1100 includes a subsystem 1101, e.g., a CPU, a subsystem 1102, e.g., a GPU that may be coupled with a display device, one or more subsystems 1108, e.g., one or more I/O controllers coupled to one or more I/O devices, a memory 1103 (e.g., a volatile RAM, a ROM, and a non-volatile memory, e.g., a hard drive) and a power monitor 1106, that includes e.g., a microcontroller, which may be coupled to a bus 1109 and/or coupled directly to other components such as sampler 1104, and electronic load 1105. As shown in FIG. 1, one or more imprecise sensors 1107 that have a resistance and an inductance, are coupled to subsystems 1101, 1102, 1108, and to power monitor 1106, e.g., a microcontroller. Further, one or more imprecise sensors 1107 are coupled to an electronic load 1105 that includes a switch and a fixed load, and a sampler 1104, e.g., a ADC, as described above with respect to FIGS. 2-10. One or more imprecise sensors are used to measure and monitor actual power usage by one or more of the subsystems 1101, 1102, and 1108. The imprecise sensors are calibrated by power monitor 1106 using methods, as described above with respect to FIGS. 12-14, to measure and monitor power usage by one or more subsystems. One or more imprecise sensors 1107 pass through an input current from a power supply (not shown). Electronic load 1105 coupled to one or more sensors 1107 induces a fixed change in the input current. Power monitor 1106 coupled to one or more sensors 1107 and to electronic load 1105 changes an input current through one or more sensors 1107 by a predetermined amount to obtain a difference in an output signal from one or more sensors 1107. Next, power monitor 1106 determines a transfer function, e.g., a DC resistance, of one or more sensors 1107 based on the difference, as described above with respect to FIGS. 3, and 12-14, and then determines the actual current through subsystems 1101, 1102, and 1108 based on the transfer function. In one embodiment, power monitor 1106 receives samples of the output signal from sampler 1104 coupled to one or more imprecise sensors 1107. Power monitor stores the samples in memory 1103, as described above with respect to FIGS. 12 and 13.

Methods and apparatuses to calibrate imprecise sensor elements described above with respect to FIGS. 2-14 may be used to manage power of a data-processing system. Exemplary embodiments of power managing of the data-processing system are provided below. In one embodiment, the data-processing system includes one or more subsystems coupled to each other. The one or more subsystems may include a microprocessor, a microcontroller, a central processing unit ("CPU"), a graphics processing unit ("GPU"), a memory, or any combination thereof. The one or more subsystems are operated at one or more performance points. In one embodiment, operating the subsystem at the one or more performance points may include operating the subsystem at a set of frequencies that determine a speed of the system, operating the subsystem at a predetermined temperature, or a combination thereof. The power consumed by each of the subsystems at each of the performance points may be measured. To measure the power consumed by a subsystem and/or data-processing system, a sensor element coupled to the subsystem within a data-processing system is calibrated at least once. The calibrating of the sensor element includes switching in an additional load for at least a period of time and measuring a parameter of the sensor element when the additional load is switched in, as described above with respect to FIGS. 2-14. Next, an electrical parameter, e.g., power, frequency, and the like, of the data-processing system is measured using the calibrated sensor element. In response to measuring, an operating parameter, e.g., operating power, frequency, speed, temperature, or any combination thereof, at one or more performance points of the subsystem and/or data-processing system is adjusted. In one embodiment, the sensor element is calibrated one or more times during operation of the data-processing system. In one embodiment, calibrating of the sensor element is performed repeatedly over time. In one embodiment, the sensor element is calibrated one or more times during operation of the data-processing system, as described above. In one embodiment, the sensor element is calibrated repeatedly over time, as described above. Calibrating of the sensor element may be improved by taking a small number of measurements over a large number of samples, wherein each of the samples contains a small number of measurements, as described above.

In another embodiment, one or more subsystems of a data-processing system is operated at well-known conditions, e.g., to provide a maximum power consumption by each of the one or more subsystems, at one or more performance points. The power consumed by each of the one or more subsystems at each of the one or more performance points is measured using the imprecise sensors that are calibrated using methods and apparatuses described above with respect to FIGS. 2-14. An operational power of each of the one or more subsystems is determined based on a measured power. Next, the operational powers may be provided to one or more power distribution tables. Next, the power is distributed among the one or more subsystems based on the operational powers.

In another embodiment, a data-processing system includes one or more first components capable of being dynamically throttled to a plurality of different performance level settings; one or more second components coupled to the one or more first components; and one or more power usage sensors coupled to the one or more first components and the one or more second components. The one or more power usage sensors that are calibrated using methods and apparatuses described above with respect to FIGS. 2-14 are used to determine information on power usage during a first time period of operation of the data-processing system. The data-processing system includes a computing element, e.g., a microcontroller; and a Central Processing Unit (CPU) microprocessor, to determine one of the performance level settings of the one or more first components of the data-processing system for a second time period, which is subsequent to the first time period, using the information on the power usage during the first time period.

In an embodiment, the one or more first components, the one or more second components, and the one or more power usage sensors are within a housing for the data-processing system. In an embodiment, the data-processing system is portable.

In an embodiment, the one or more first components include a microprocessor having a plurality of performance level settings at a plurality of core voltages and a plurality of core frequencies. The microprocessor may be a Central Processing Unit (CPU) microprocessor and/or a Graphical Processing Unit (GPU) microprocessor.

In an embodiment, the one of the performance-level settings is determined to limit a power-usage indicator under a threshold in the second time period; and the power-usage indicator represents a function of power usage over a period of time including the first time period and the second time period.

In an embodiment, the computing element further determines an estimated power usage used by the one or more second components in the second time period; and the one of the performance-level settings is determined from the threshold, the estimated power usage used by the one or more second components, and the information on the power usage during the first time period.

In an embodiment, the one or more first components include a plurality of first components with independent adjustable performance-level settings; and a performance-level setting of each of the plurality of first components is determined using the information on the power usage during the first time period, the threshold and the estimated power usage used by the one or more second components.

In an embodiment, the one or more power usage sensors that are calibrated using methods and apparatuses described above, includes a first sensor to determine first information on power usage used by the one or more first components during the first time period, and a first sensor to determine second information on power usage used by the one or more second components during the first time period. The estimated power usage may be determined based on the second information on power usage used by the one or more second components during the first time period.

In an embodiment, the information on the power usage includes indicators of currents and/or voltages at the plurality of time instances in the first time period. The one or more power usage sensors calibrated using methods described above determine information indicating actual current and/or voltage drawn at a plurality of time instances in the first time period.

In another embodiment, a method to manage power usage in a data-processing system includes determining information on power usage during a first time period of operation of the data-processing system using sensor elements calibrated using methods and apparatuses described above. Then, using the information on the power usage during the first time period, a performance level setting of a component of the data-processing system for a second time period, which is subsequent to the first time period, is determined.

In an embodiment, the performance-level setting is determined to limit a power usage indicator under a threshold in the second time period; and the power usage indicator is a function of a history of power usage in the data-processing system.

In one embodiment, the data-processing system includes one or more first components to be throttled in performance levels and one or more second components not to be throttled in performance levels; and the method further includes: determining an estimated power usage used by the one or more second components in the second time period by sensing elements calibrated using methods and apparatuses described above with respect to FIGS. 2-14. The performance level setting in the second time period is determined from the threshold, the estimated power usage used by the one or more second components, and the information on the power usage during the first time period.

In one embodiment, a performance level setting of each of the one or more first components is determined using the information on the power usage during the first time period, the threshold and the estimated power usage used by the one or more second components.

In one embodiment, determining the performance level setting includes determining an allowable power budget in the second time period for the one or more first components of the data-processing system based on the threshold, the estimated power usage used by the one or more second components, and the information on the power usage during the first time period.

In one embodiment, the information on the power usage during the first time period includes first information on power usage used by the one or more first components during the first time period; and second information on power usage used by the one or more second components during the first time period. In one example, the estimated power usage may be determined based on the second information on power usage used by the one or more second components during the first time period.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to monitor power in a system, the method comprising:
   changing a first input signal through one or more sensors coupled to a load by a predetermined amount;
   obtaining using a processor a difference in an output signal from the one or more sensors in response to the changing;
   determining using a processor a transfer function of the one or more sensors based on the difference; and
   predicting using a processor a second input signal through the load based on the transfer function.

2. The method of claim 1, wherein the determining of the transfer function is performed over time.

3. The method of claim 1, wherein the one or more sensors have an inductance.

4. The method of claim 1, wherein the transfer function is a DC resistance.

5. The method of claim 1, wherein the obtaining includes sampling the output signal;
   determining a distribution of samples of the output signal;
   determining estimated parameters of the distribution that most likely to explain actual data.

6. The method of claim 1, wherein the difference in the output signal includes the difference in voltage levels of the output signal before and after the changing.

7. The method of claim 1, wherein the difference in the output signal includes the difference in a duty cycle of the output response signal before and after the changing.

8. The method of claim 1, wherein the obtaining includes sampling the output signal at a first time that depends on a second time of the changing of the first input signal.

9. A system to monitor power, comprising:
   one or more sensors coupled to a first load to pass through a first input current;
   an electronic load coupled to the one or more sensors to induce a change in the first input current; and
   a power monitor coupled to the one or more sensors, wherein the first input current through the one or more sensors is changed by a predetermined amount, wherein the power monitor is configured to obtain a difference in an output signal from the one or more sensors caused by the changing; and wherein the power monitor is configured to determine a transfer function of the one or more sensors based on the difference and to predict a second input current through the first load based on the transfer function.

10. The system of claim 9, further comprising
    a power source coupled to the one or more sensors to provide the first input current;
    a data-processing component coupled to the power source, and wherein the power monitor determines a power state of the data-processing component based at least in part on the first input current.

11. The system of claim 9, wherein the electronic load includes a switch, and a second load.

12. The system of claim 9, wherein the one or more sensors have an inductance.

13. The system of claim 9, further comprising a sampler coupled to the one or more sensors and configured to sample the output signal, wherein the power monitor is further configured to receive samples of the output signal, to store the samples, to determine a distribution of samples of the output signal, and to determine estimated parameters of the distribution that most likely to explain actual data.

14. The system of claim 9, further comprising a memory coupled to the power monitor to store the samples of the output signal.

15. An article of manufacture, comprising:
   a non-transitory machine-accessible storage medium including data that, when accessed by a machine, cause the machine to perform operations to monitor power comprising,
   changing a first input signal through one or more sensors coupled to a load, by a predetermined amount;
   obtaining a difference in an output signal from the one or more sensors in response to the changing;
   determining a transfer function of the one or more sensors based on the difference; and
   determining a second input signal through the load using the transfer function.

16. The article of manufacture of claim 15, wherein the determining of the transfer function is performed over time.

17. The article of manufacture of claim 16, wherein the one or more sensors have an inductance.

18. The article of manufacture of claim 16, wherein the transfer function is a DC resistance.

19. The article of manufacture of claim 16, wherein the obtaining includes
   sampling the output signal;
   determining a distribution of samples of the output signal;
   determining estimated parameters of the distribution that most likely to explain actual data.

20. The article of manufacture of claim 16, wherein the difference in the output signal includes the difference in voltage levels of the output signal before and after the changing.

21. The article of manufacture of claim 16, wherein the difference in the output signal includes the difference in a duty cycle of the output signal before and after the changing.

22. The article of manufacture of claim 16, wherein the obtaining includes sampling the output signal at a first time that depends on a second time of the changing of the first input signal.

23. A system to monitor power, comprising:
   means for changing a first input signal through one or more sensors coupled to a load by a predetermined amount;
   means for obtaining a difference in an output signal from the one or more sensors in response to the changing;
   means for determining a transfer function of the one or more sensors based on the difference; and
   means for predicting a second input signal through the load using the transfer function.

* * * * *

UNITED STATES PATENT AND TRADEMARK OFFICE
CERTIFICATE OF CORRECTION

PATENT NO. : 7,945,412 B2  Page 1 of 1
APPLICATION NO. : 12/359966
DATED : May 17, 2011
INVENTOR(S) : John Gregory Dorsey et al.

It is certified that error appears in the above-identified patent and that said Letters Patent is hereby corrected as shown below:

In column 4, line 15, delete "monitoring." and insert -- monitoring; and --, therefor.

In column 5, line 10, delete "such" and insert -- such as --, therefor.

In column 9, line 44, delete "0." and insert -- θ. --, therefor.

In column 11, line 60, delete "FIG. 5A" and insert -- FIG. 8A --, therefor.

In column 15, line 3, delete "FIG. 1," and insert -- FIG. 11, --, therefor.

Signed and Sealed this
Twenty-ninth Day of November, 2011

David J. Kappos
*Director of the United States Patent and Trademark Office*